(12) United States Patent
Chen et al.

(10) Patent No.: US 11,036,390 B2
(45) Date of Patent: Jun. 15, 2021

(54) DISPLAY METHOD OF DISPLAY APPARATUS

(71) Applicant: MPI Corporation, Hsinchu County (TW)

(72) Inventors: Chien-Hung Chen, Hsinchu County (TW); Guan-Jhih Liou, Hsinchu County (TW); Lin-Lin Chih, Hsinchu County (TW); Stojan Kanev, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 237 days.

(21) Appl. No.: 16/351,008

(22) Filed: Mar. 12, 2019

(65) Prior Publication Data

US 2019/0361074 A1 Nov. 28, 2019

Related U.S. Application Data

(60) Provisional application No. 62/676,308, filed on May 25, 2018.

(51) Int. Cl.
| | |
|---|---|
| *G01R 31/319* | (2006.01) |
| *G01R 31/317* | (2006.01) |
| *G06F 3/0488* | (2013.01) |
| *G09G 3/00* | (2006.01) |
| *G06F 3/0484* | (2013.01) |

(52) U.S. Cl.
CPC ... *G06F 3/04886* (2013.01); *G01R 31/31728* (2013.01); *G01R 31/31912* (2013.01); *G06F 3/0488* (2013.01); *G06F 3/04845* (2013.01); *G09G 3/006* (2013.01); *G06F 2203/04803* (2013.01); *G06F 2203/04808* (2013.01)

(58) Field of Classification Search
None
See application file for complete search history.

(56) References Cited

U.S. PATENT DOCUMENTS

| | | | | |
|---|---|---|---|---|
| 9,250,780 | B2* | 2/2016 | Wang | G06F 3/0481 |
| 10,394,441 | B2* | 8/2019 | Louch | G06F 3/0488 |
| 10,747,420 | B2* | 8/2020 | Cho | G06F 3/0488 |
| 10,908,776 | B2* | 2/2021 | Chen | G06F 9/451 |
| 2013/0227472 | A1* | 8/2013 | Sosinski | G06F 3/04883 |
| | | | | 715/794 |
| 2015/0016727 | A1 | 1/2015 | Latin-Stoermer et al. | |

(Continued)

FOREIGN PATENT DOCUMENTS

TW 201627851 A 8/2016

*Primary Examiner* — Jermele M Hollington
(74) *Attorney, Agent, or Firm* — Birch, Stewart, Kolasch & Birch, LLP

(57) ABSTRACT

A display method of a display apparatus is provided. The method includes: displaying, on a touch display apparatus, a first window and a second window that overlap with each other, where the first window is smaller than the second window; displaying a first image on the first window, and displaying a second image on the second window, where the second image is an image captured by the camera module in real time; displaying the first image on the second window and displaying the second image on the first window according to the first touch instruction; and displaying the first image on the first window and displaying the second image on the second window according to the second touch instruction.

8 Claims, 6 Drawing Sheets

(56) References Cited

U.S. PATENT DOCUMENTS

| | | | |
|---|---|---|---|
| 2015/0121300 A1* | 4/2015 | Wang | G06F 3/04845 |
| | | | 715/790 |
| 2015/0212610 A1* | 7/2015 | Tian | G06F 3/04886 |
| | | | 345/173 |
| 2017/0094187 A1* | 3/2017 | Sharma | G03B 13/36 |
| 2019/0171328 A1* | 6/2019 | Chih | G06T 7/0004 |
| 2019/0361603 A1* | 11/2019 | Chen | G06F 3/0488 |

* cited by examiner

DISPLAY METHOD OF DISPLAY APPARATUS

CROSS-REFERENCE TO RELATED APPLICATION

This non-provisional application claims priority under 35 U.S.C. § 119(e) to U.S. Provisional Patent Application No. 62/676,308, filed on May 25, 2018, the entire contents of which are hereby incorporated by reference.

BACKGROUND

Technical Field

The present invention relates to a display method, in particular to a wafer display method of a display apparatus of a wafer probe station.

Related Art

In a common wafer probe station, a wafer is mounted on a chuck stage. The wafer probe station is controlled by a software user interface. The software displays a digital wafer map or a real time image of the wafer, captured by a camera mounted to a microscope, on a video screen. During the setup and test process it is necessary to switch between both views. This can be done by using two monitors or arranging the two windows somehow on one screen which is not very convenient.

SUMMARY

The present invention provides a display method of a display apparatus applicable to a probe station having a camera module. The display method of a display apparatus includes: displaying a first window and a second window on a display apparatus, where the first window and the second window overlap with each other, and the size of the first window is smaller than that of the second window; displaying a first image and a first pointer on the first window, and displaying a second image and a second pointer on the second window, where the second image is an image captured by the camera module in real time; detecting a first touch instruction generated on the first window, and displaying the first image on the second window and displaying the second image on the first window according to the first touch instruction; and detecting a second touch instruction generated on the first window, and displaying the first image on the first window and displaying the second image on the second window according to the second touch instruction.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
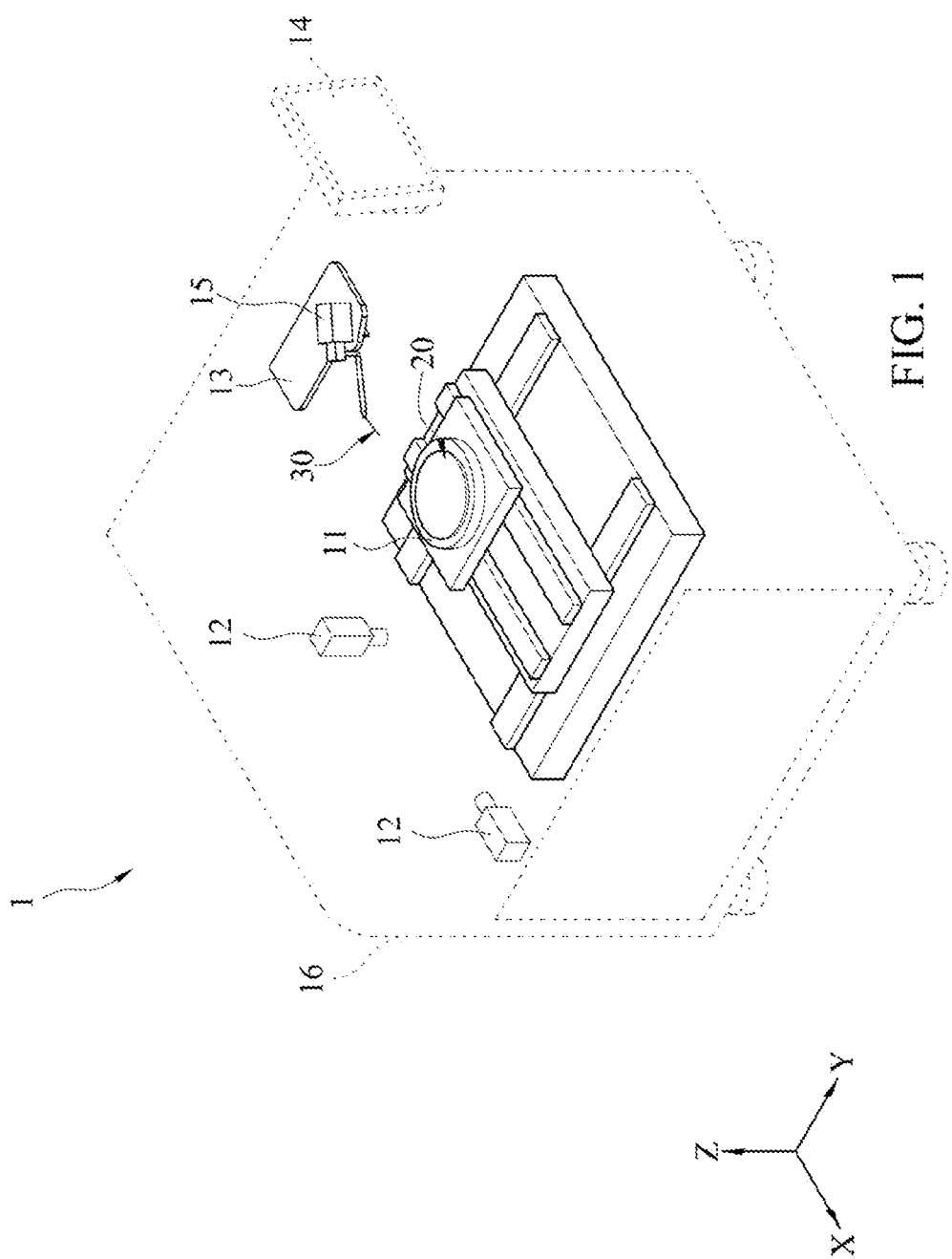
FIG. 1 shows a probe station to which an embodiment of a display method of a display apparatus is applicable according to the present invention.
Figure 2:
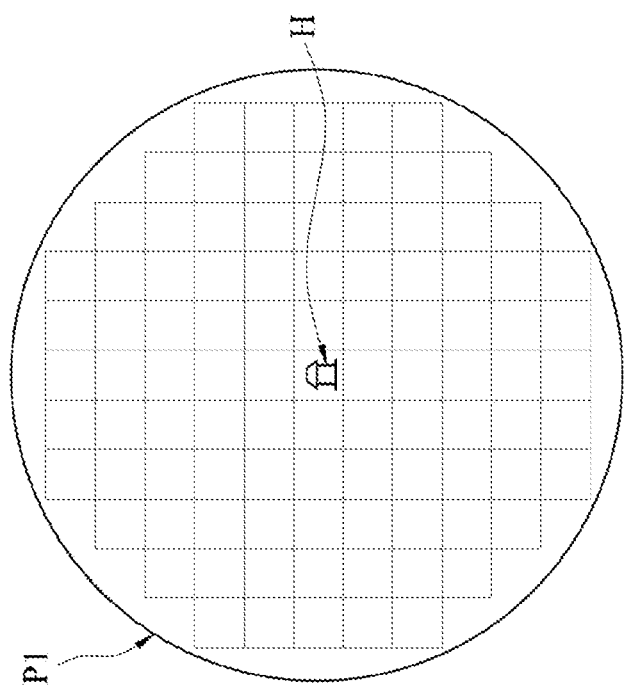
FIG. 2 is a schematic diagram of a first image in an embodiment of a display method of a display apparatus according to the present invention.
Figure 3:
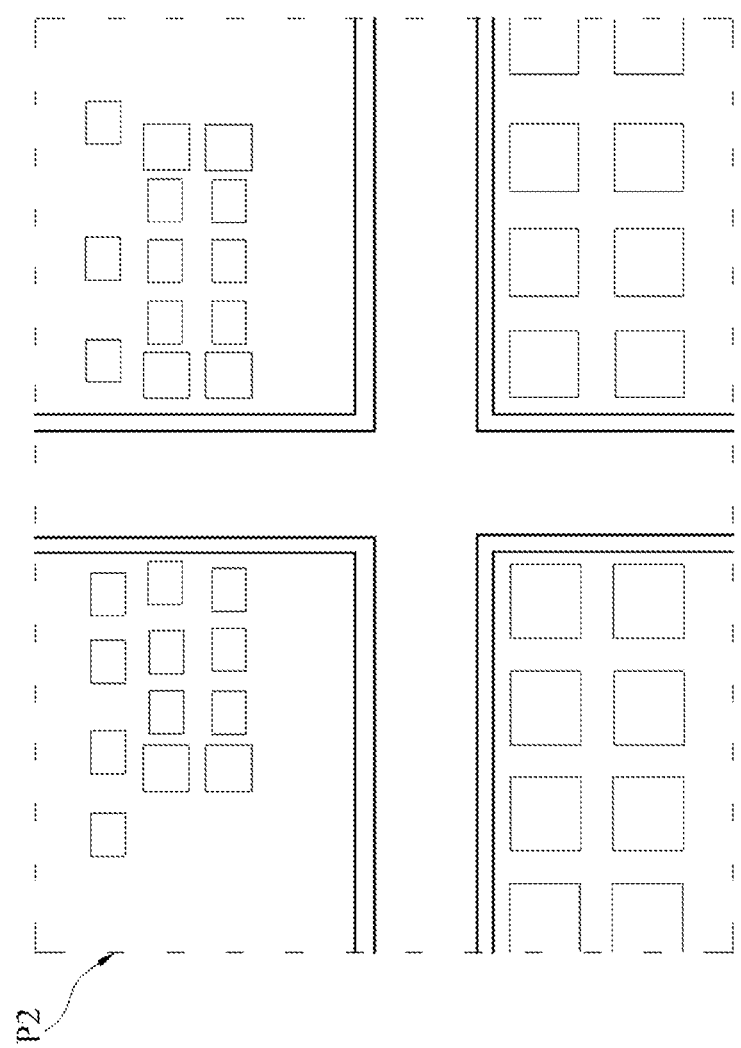
FIG. 3 is a schematic diagram of a second image in an embodiment of a display method of a display apparatus according to the present invention.
Figure 4:
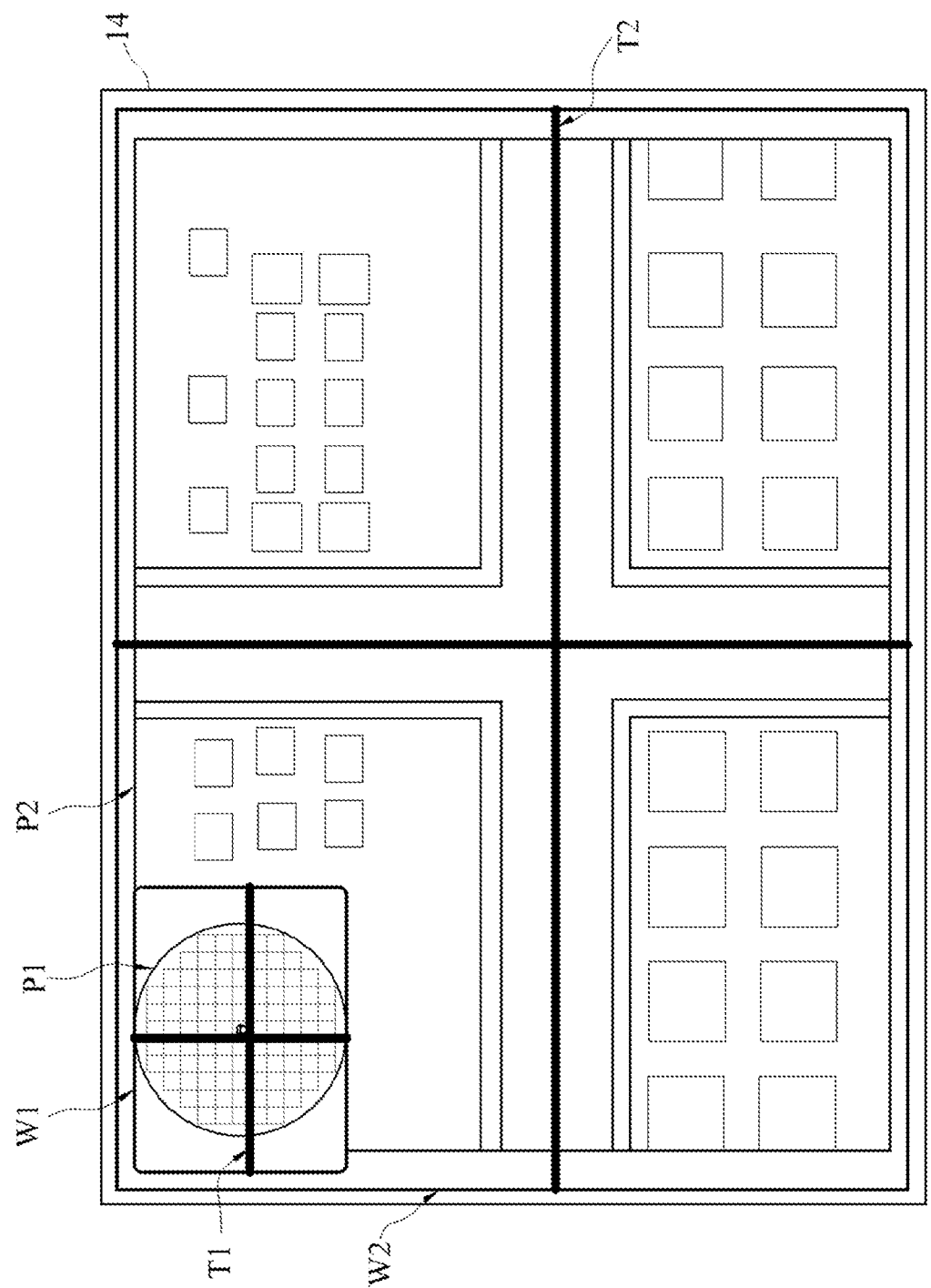
FIG. 4 is a schematic diagram of displaying a first window and a second window by a touch display apparatus in an embodiment of a display method of a display apparatus according to the present invention.

Referring to FIG. 1, FIG. 1 shows a probe station to which an embodiment of a display method of a display apparatus is applicable according to the present invention. The probe station 1 shown in FIG. 1 includes a chuck stage 11, a camera module 12, a probe platen 13, a touch display apparatus 14, a positioner 15, and a casing 16. The chuck stage 11, the camera module 12, the probe platen 13, and the positioner 15 are movable elements. The touch display apparatus 14 may be configured to display a digital wafer map, a digital calibration substrate map, and an image captured by the camera module 12 in real time. The positioner 15 is disposed on the probe platen 13. In addition to moving along with the probe platen 13, the positioner 15 alone can move relative to the probe platen 13. The camera module 12 may capture an image above the chuck stage 11 along a Z axis direction, or may capture an image along a side of the casing 16 along an X axis direction or a Y axis direction. In addition, the movable elements are not limited to the chuck stage 11, the camera module 12, the probe platen 13, and the positioner 15.

Still referring to FIG. 1, a wafer 20 is mounted on the chuck stage 11 of the probe station 1, and a probe 30 is fixed on the positioner 15. Herein, the probe 30 may be disposed on the positioner 15 and then be disposed on the probe platen 13 or may be disposed on a probe card and then be disposed on the probe platen 13. The present invention is not limited thereto. The probe platen 13 of the probe station 1 may be displaced to approach the chuck stage 11, the probe 30 on the probe platen 13 is in contact with the wafer 20, and a tip of the probe 30 is in contact with the wafer 20 and pierces an oxide layer to form an electrical connection to perform detection.

Referring to FIG. 1 to FIG. 4, herein, the touch display apparatus 14 of the probe station 1 is mainly used to display image information of the wafer 20 in a detection process of the probe station 1 for a user to conveniently learn of a detection status. One step of the display method of a display apparatus in the present invention is displaying a first window W1 and a second window W2 on the touch display apparatus 14. In an embodiment, the second window W2 is used to display most of a range of an image in the touch display apparatus 14, and the first window W1 is used to display a subrange in the range of the image in the touch display apparatus 14. To be specific, in this embodiment, the first window W1 and the second window W2 overlap with each other, and the size of the first window W1 is smaller than that of the second window W2. Therefore, the first window W1 and the second window W2 are simultaneously displayed on the touch display apparatus 14, so that the user can obtain the image information of the wafer 20 in the detection process from both the first window W1 and the second window W2.

Further, referring to FIG. 1 to FIG. 4, a first image P1 is displayed on the first window W1, a second image P2 is displayed on the second window W2, and the second image P2 is an image captured by the camera module 12 in real time. In an embodiment, the first image P1 may be a digital wafer map. The outline of the digital wafer map is circular or rectangular. The present invention is not limit there to. In this embodiment, the outline of the digital wafer map is circular. The digital wafer map is segmented into a plurality of grids, and each grid is equivalent to a die formed on the wafer. Herein, the camera module 12 captures a real image of the wafer 20 on the chuck stage 11. Therefore, the digital wafer map and a real-time image of the wafer 20 are simultaneously displayed on the first window W1 and the second window W2 of the touch display apparatus 14. The user may perform synchronous comparison and observation on the touch display apparatus 14.

Figure 5:
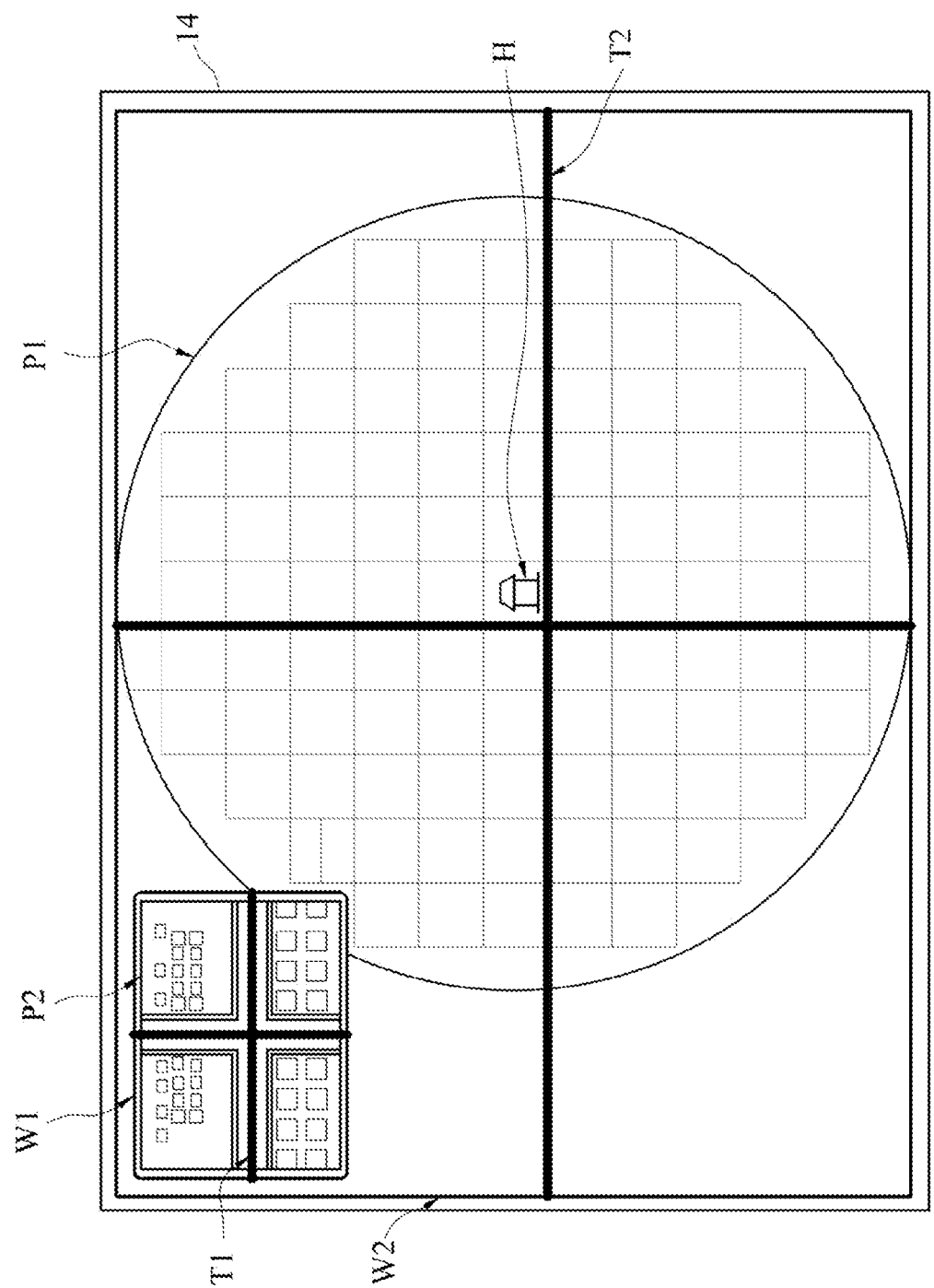
FIG. 5 is a schematic diagram of another state in which a touch display apparatus displays a first window and a second window in an embodiment of a display method of a display apparatus according to the present invention.

Then, referring to FIG. 5, another step of the display method of a display apparatus is detecting a first touch instruction generated on the first window W1, and displaying the first image P1 on the second window W2 and displaying the second image P2 on the first window W1 according to the first touch instruction. In this embodiment, an example of a state (which is a display state in FIG. 4) in which when the touch display apparatus 14 is started, the first image P1 is displayed on the first window W1 and the second image P2 is displayed on the second window W2 is used, but the present invention is not limited thereto. Further, the first touch instruction may be performing an action of tap, sliding, or multi-touch at a position of the first window W1 on the touch display apparatus 14. To be specific, when the operator performs an action of tap, sliding, or multi-touch at a position of the touch display apparatus 14 corresponding to the first window W1, the first window W1 may detect the first touch instruction. Certainly, in other embodiments, a touch action capable of generating the first touch instruction may also be user-defined.

Herein, after the first touch instruction is detected, images displayed on the first window W1 and the second window W2 are switched. To be specific, in this embodiment, after the first touch instruction is detected, the first image P1 is displayed on the second window W2 and the second image P2 is displayed on the first window W1 according to the first touch instruction. Therefore, because the sizes of the first window W1 and the second window W2 are different, the user can control, according to observation needs, the first image P1 and the second image P2 to be displayed on the first window W1 or the second window W2.

Further, another step of the display method of a display apparatus is detecting a second touch instruction generated on the first window W1, and displaying the first image P1 on the first window W1 and displaying the second image P2 on the second window W2 according to the second touch instruction. In this embodiment, the second touch instruction is a touch instruction that is performed after the first touch instruction. Certainly, the present invention is not limited thereto. In other embodiments, the second touch instruction may also be distinguished from the first touch instruction by different touch actions.

Herein, after the second touch instruction is detected, images displayed on the first window W1 and the second window W2 are switched again. To be specific, in this embodiment, after the second touch instruction is detected, the first image P1 is displayed on the first window W1 and the second image P2 is displayed on the second window W2 according to the second touch instruction. Therefore, the user can freely control, according to observation requirements, the first image P1 and the second image P2 to be displayed on the first window W1 or the second window W2.

In an embodiment, to make it easy for the operator to correspondingly observe the first image P1 and the second image P2, the first window W1 further displays a first pointer T1 while displaying the first image P1, and the second window W2 further displays a second pointer T2 while displaying the second image P2. In addition, a relative position of the first pointer T1 on the first image P1 is the same as a relative position of the second pointer T2 on the second image P2. Specifically, the first pointer T1 and the second pointer T2 may be but are not limited to crosses. In other embodiments, the first pointer T1 and the second pointer T2 may be arrow symbols, other indicative symbols, or outstanding prompts for a die range.

In this embodiment, that the relative position of the first pointer T1 on the first image P1 is the same as the relative position of the second pointer T2 on the second image P2 means that, for example, when the first pointer T1 points to a die at a middle position of the digital wafer map, the second pointer T2 also points to a die at a middle position of the wafer 20 on the chuck stage 11. In this way, the detection operator can observe a status of the wafer 20 at a current detection position from the second image P2 and can observe a position in the digital wafer map corresponding to the current detection position of the wafer 20 from the first image P1.

In an embodiment, the second window W2 of the touch display apparatus may further detect a displacement instruction. When the second window W2 detects the displacement instruction, the second pointer T2 moves according to the displacement instruction, and the first pointer T1 moves corresponding to the second pointer T2. Specifically, the displacement instruction may be performing an action of tap, sliding, or multi-touch at a position of the second window W2 on the touch display apparatus 14. To be specific, when the operator performs an action of tap, sliding, or multi-touch at a position of the touch display apparatus 14 corresponding to the second window W2, the second window W2 may detect the displacement instruction. To distinguish the displacement instruction from the second touch instruction, the second touch instruction may be set to different from the second touch instruction.

Further, in an embodiment in which the displacement instruction is tap, tap is performed at a position other than the second pointer T2 on the second window W2. Then, the second pointer T2 moves to the target point for tap, and point-to-point movement is provided. In an embodiment in which the displacement instruction is sliding, the displacement instruction may be set as follows: the user first touches the position of the second pointer T2, and then drags the second point T2 to move without releasing the contact with the second pointer T2. Therefore, the second pointer T2 can be displaced to a required position along with a drag action of the user. In addition, in an embodiment in which the displacement instruction is multi-touch, it may be set that the displacement instruction can be considered to be effective only when the second window W2 simultaneously detects a quantity of touch positions that meets a set value and a touch action that meets a set value. For example, the displacement instruction can considered to be effective only when the detection operator performs a touch action of simultaneously dragging the second pointer T2 with three fingers. However, the foregoing implementation modes of the displacement instruction are only for illustrative description, and the present invention is not limited to the foregoing descriptions.

Further, in the probe station 1, when the second window W2 detects the displacement instruction and the first pointer T1 moves corresponding to the second pointer T2, the chuck stage 11 or the camera module 12 of the probe station 1 may also substantially move. For example, meanwhile, the chuck stage 11 moves, based on the displacement instruction, to the displacement instruction generated by the detection operator on the second window W2. In this embodiment, when one of the first pointer T1 and the second pointer T2 moves, the chuck stage 11 moves simultaneously.

In an embodiment, the second window W2 of the touch display apparatus 14 may further detect an image scaling instruction. When the second window W2 detects the image scaling instruction, an image ratio of the first image P1 or the second image P2 displayed on the second window W2 may be changed according to the image scaling instruction. Therefore, the detection operator can more comprehensively observe the wafer 20 or the digital wafer map from the second window W2. Further, the image scaling instruction may be but is not limited to multi-touch. Specifically, multi-touch of the image scaling instruction may be, for example, an image scaling instruction generated by means of sliding that makes two fingers relatively close to or far away from each other.

Further, it can be learned from the above that the image ratio of the first image P1 or the second image P2 on the first window W1 of the touch display apparatus 14 is a fixed ratio. To be specific, a touch instruction on the first window W1 of the touch display apparatus 14 may only be an instruction of switching displayed images.

Specifically, in addition to that the ratio of the first image P1 or the second image P2 displayed on the first window W1 cannot be scaled, the first window W1 displays the entire picture of the first image P1 when displaying the first image P1, and the first window W1 displays the entire picture of the second image P2 when displaying the second image P2. In this way, it can be ensured that the entire picture of the digital wafer map or the entire picture of the real-time image of the wafer 20 can be frequently displayed on the touch display apparatus 14. In this way, when a magnification of the first image P1 or the second image P2 displayed on the second window W2 is relatively large, and consequently, only a part of the image can be displayed, the user can quickly observe from the first window W1 a position in the entire wafer 20 or digital wafer map at which a current detection position is located.

Figure 6:
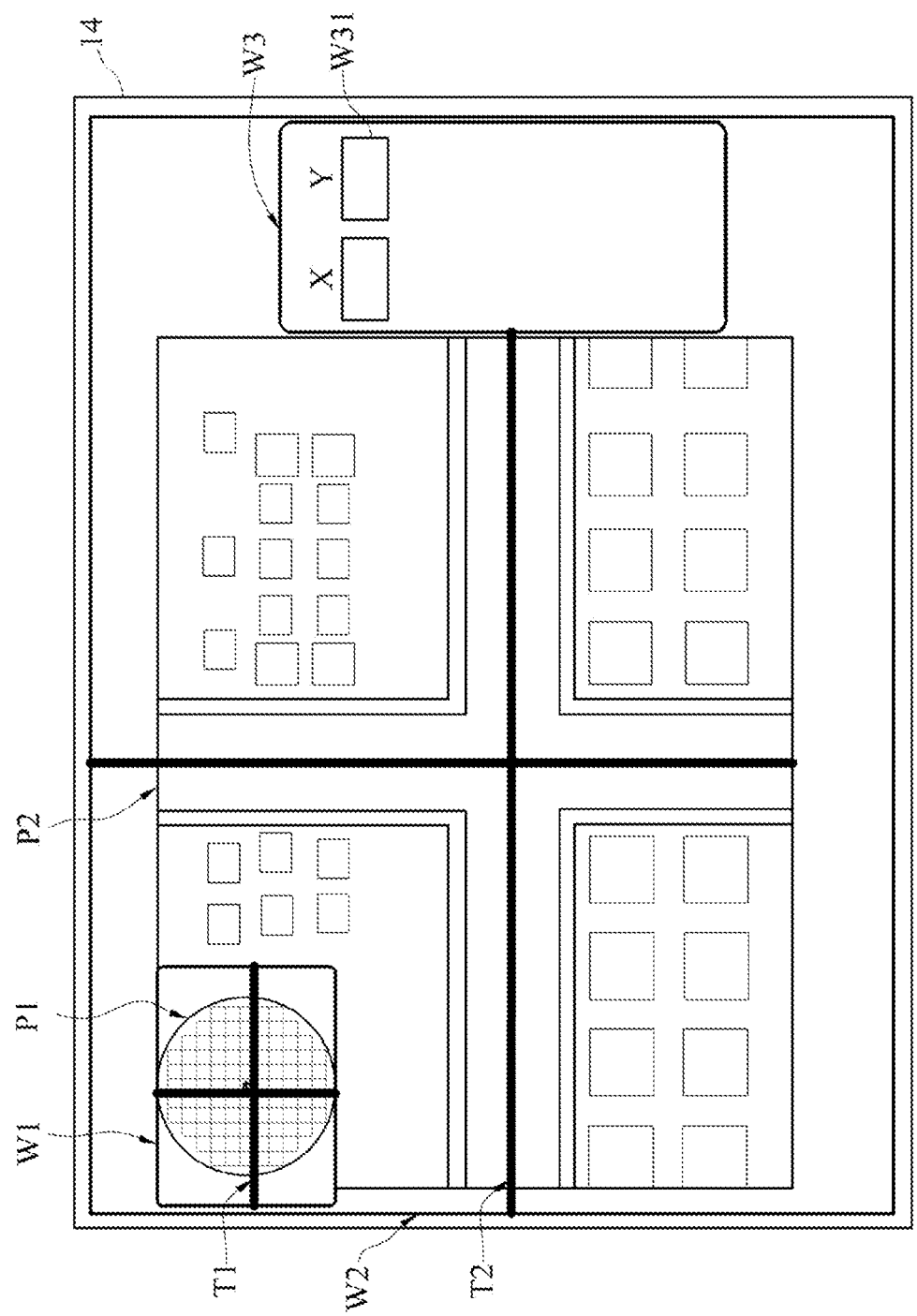
FIG. 6 is a schematic diagram of a state in which a touch display apparatus simultaneously displays a first window, a second window, and a third window in an embodiment of a display method of a display apparatus according to the present invention.

Referring to FIG. 6, in an embodiment, the touch display apparatus 14 further displays a third window W3. The third window W3 is used to display numerical or visualized control information. In this embodiment, the first window W1 may further display a standard mark H when displaying the first image P1, and the numerical control information is displayed on the third window W3. Specifically, a plurality of value input panes W31 is displayed on the third window W3, and the value input pane W31 may be a movement amount corresponding to the X axis direction or the Y axis direction. In this embodiment, the third window W3 detects the displacement instruction, the second pointer T2 moves according to the displacement instruction, and the first pointer T1 moves corresponding to the second pointer T2. Specifically, the displacement instruction that the third window W3 is capable of detecting is inputting, in the value input panes W31, values of displacement to be controlled. After the third window W3 detects the displacement instruction, the second pointer T2 uses the standard mark H as an origin to perform relative displacement, and a displacement amount is a value in the value input panes W31.

For example, when the detection operator enters a value A in the value input pane W31 corresponding to the X axis direction and enters a value B in the value input pane W31 corresponding to the Y axis direction, the first pointer T1 uses the standard mark H as an origin to be displaced by a distance A along the X axis direction and be displaced by a distance B along the Y axis direction. The detection operator is provided with more accurate displacement control by using the displacement instruction of the third window W3.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A display method of a display apparatus, applicable to a probe station having a camera module and comprising:
   displaying a first window and a second window on a touch display apparatus, wherein the first window and the second window overlap with each other, and the size of the first window is smaller than that of the second window;
   displaying a first image on the first window, and displaying a second image on the second window, wherein the second image is an image captured by the camera module in real time;
   detecting a first touch instruction generated on the first window, and displaying the first image on the second window and displaying the second image on the first window according to the first touch instruction; and
   detecting a second touch instruction generated on the first window, and displaying the first image on the first window and displaying the second image on the second window according to the second touch instruction,
   wherein the first image is a digital wafer map or a digital calibration substrate map.

2. The display method of a display apparatus according to claim 1, wherein the second window detects a displacement instruction, a second pointer on the second window moves according to the displacement instruction, and a first pointer on the first window moves corresponding to the second pointer.

3. The display method of a display apparatus according to claim 2, wherein the second pointer slides according to the displacement instruction.

4. The display method of a display apparatus according to claim 2, wherein the second pointer moves to a target point according to the displacement instruction.

5. The display method of a display apparatus according to claim 1, wherein the second window detects an image scaling instruction and changes, according to the image scaling instruction, an image ratio of the first image or the second image displayed on the second window.

6. The display method of a display apparatus according to claim 1, wherein the touch display apparatus further displays a third window, the third window detects a displacement instruction, the second pointer moves according to the displacement instruction, and the first pointer moves corresponding to the second pointer.

7. The display method of a display apparatus according to claim 6, wherein the first window further displays a standard mark when displaying the first image, the first pointer moves relative to the standard mark according to the displacement instruction, and the second pointer moves corresponding to the first pointer.

8. The display method of a display apparatus according to claim 1, wherein an image ratio of the first image or the second image displayed on the first window is fixed.

* * * * *